(12) United States Patent
Qi et al.

(10) Patent No.: US 10,163,635 B1
(45) Date of Patent: Dec. 25, 2018

(54) ASYMMETRIC SPACER FOR PREVENTING EPITAXIAL MERGE BETWEEN ADJACENT DEVICES OF A SEMICONDUCTOR AND RELATED METHOD

(71) Applicant: GLOBALFOUNDRIES Inc., Grand Cayman (KY)

(72) Inventors: Yi Qi, Niskayuna, NY (US); Hui Zang, Guilderland, NY (US); Hsien-Ching Lo, Clifton Park, NY (US); Jerome Ciavatti, Mechanicville, NY (US); Judson Robert Holt, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/797,794

(22) Filed: Oct. 30, 2017

(51) Int. Cl.
| | |
|---|---|
| *H01L 21/033* | (2006.01) |
| *H01L 29/06* | (2006.01) |
| *H01L 21/02* | (2006.01) |
| *H01L 21/306* | (2006.01) |
| *H01L 21/311* | (2006.01) |
| *H01L 29/861* | (2006.01) |
| *H01L 29/78* | (2006.01) |
| *H01L 49/02* | (2006.01) |

(52) U.S. Cl.
CPC .... *H01L 21/0337* (2013.01); *H01L 21/02532* (2013.01); *H01L 21/02592* (2013.01); *H01L 21/30625* (2013.01); *H01L 21/31105* (2013.01); *H01L 29/0657* (2013.01); *H01L 28/40* (2013.01); *H01L 29/785* (2013.01); *H01L 29/8613* (2013.01)

(58) Field of Classification Search
CPC .......... H01L 21/0337; H01L 21/28132; H01L 21/28141; H01L 21/30625; H01L 21/31105
See application file for complete search history.

(56) References Cited

U.S. PATENT DOCUMENTS

2018/0061640 A1* 3/2018 Liu .................. H01L 21/02274

* cited by examiner

*Primary Examiner* — Hoai V Pham
(74) *Attorney, Agent, or Firm* — Ditthavong & Steiner, P.C.

(57) ABSTRACT

A method for preventing epitaxial merge between adjacent devices of a semiconductor is provided. Embodiments include forming a protection layer over a spacer formed over a first and second plurality of fins deposited within a substrate; pinching off a portion of the protection layer formed within a space between each of the plurality of fins; forming a planarization layer over the protection layer and the spacer; and etching a portion of the spacer to form inner sidewalls between each of the plurality of fins, outer sidewalls of a height greater than the height of the inner sidewalls for preventing the growth of the epitaxial layer beyond the outer sidewalls, or a combination thereof.

13 Claims, 10 Drawing Sheets

100

100

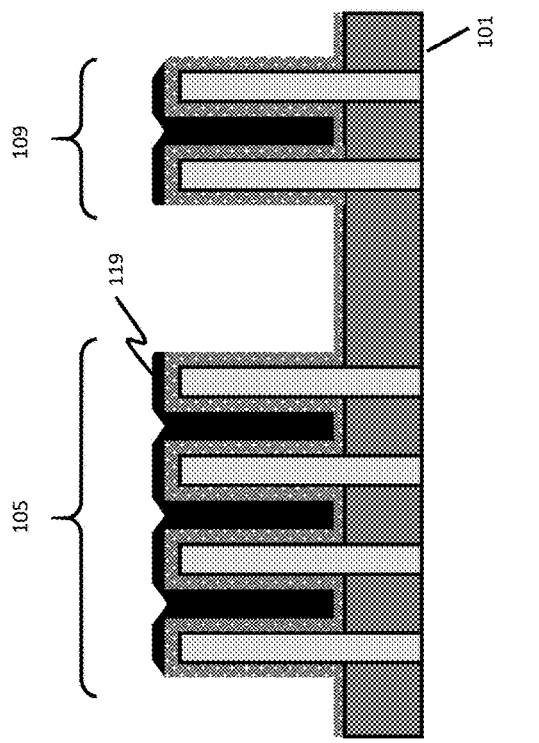
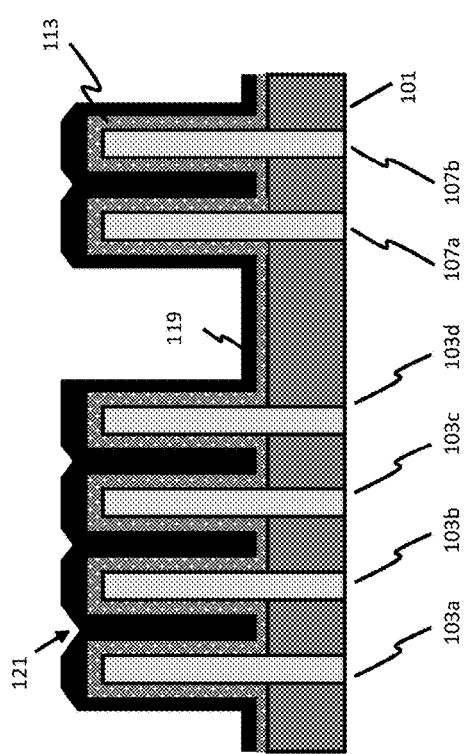

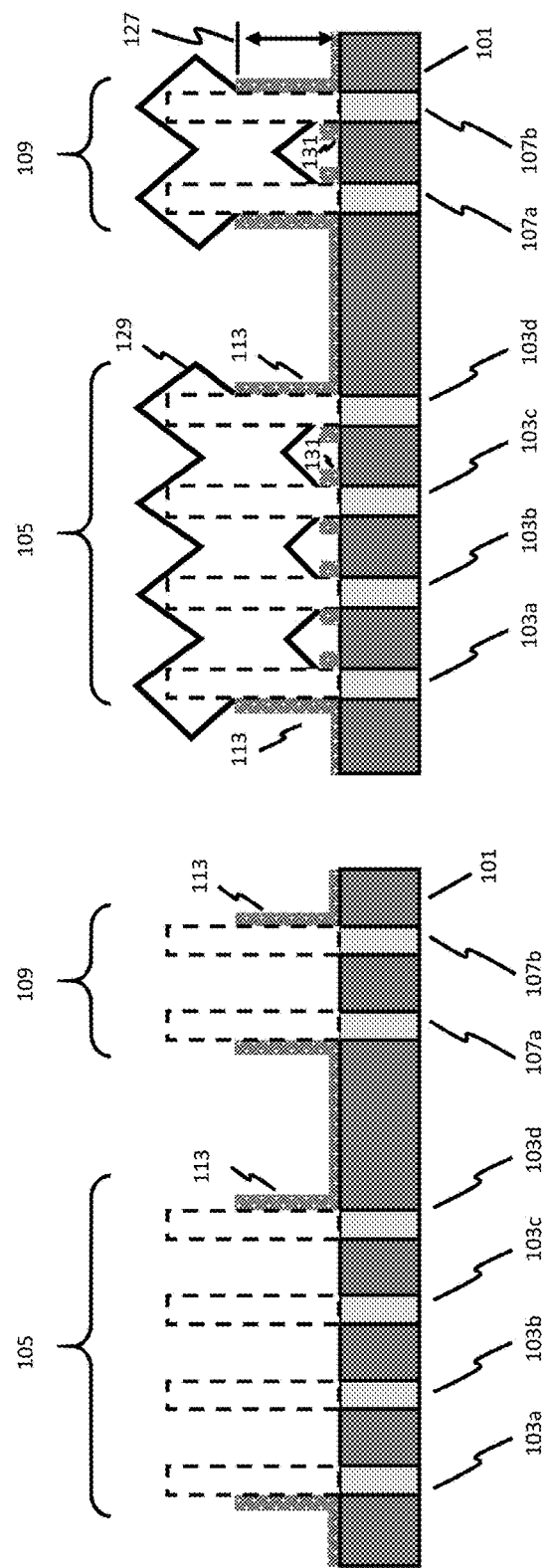

100

100

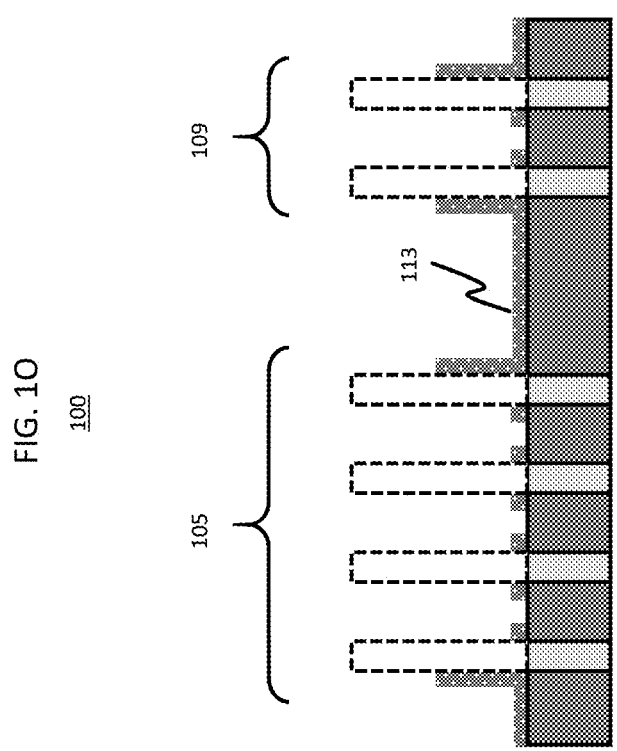

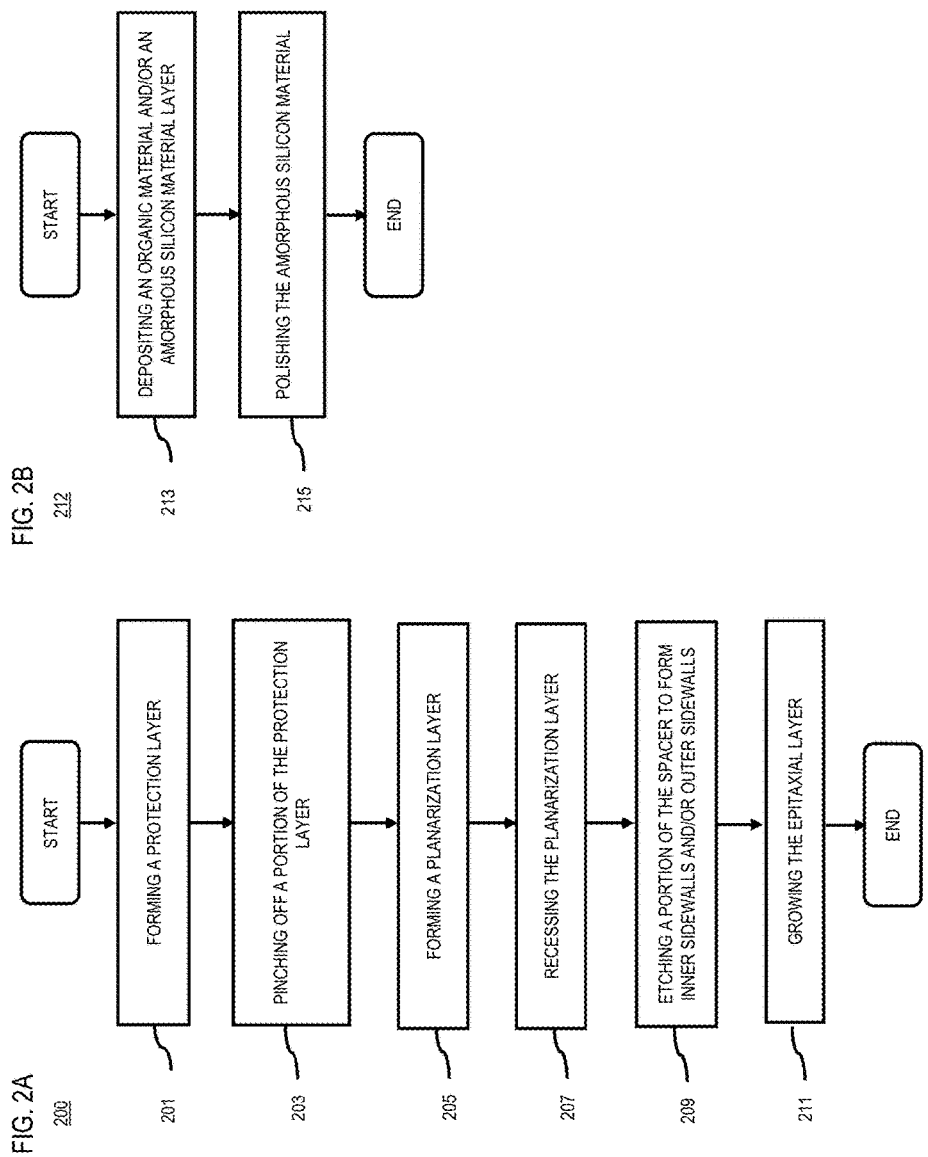

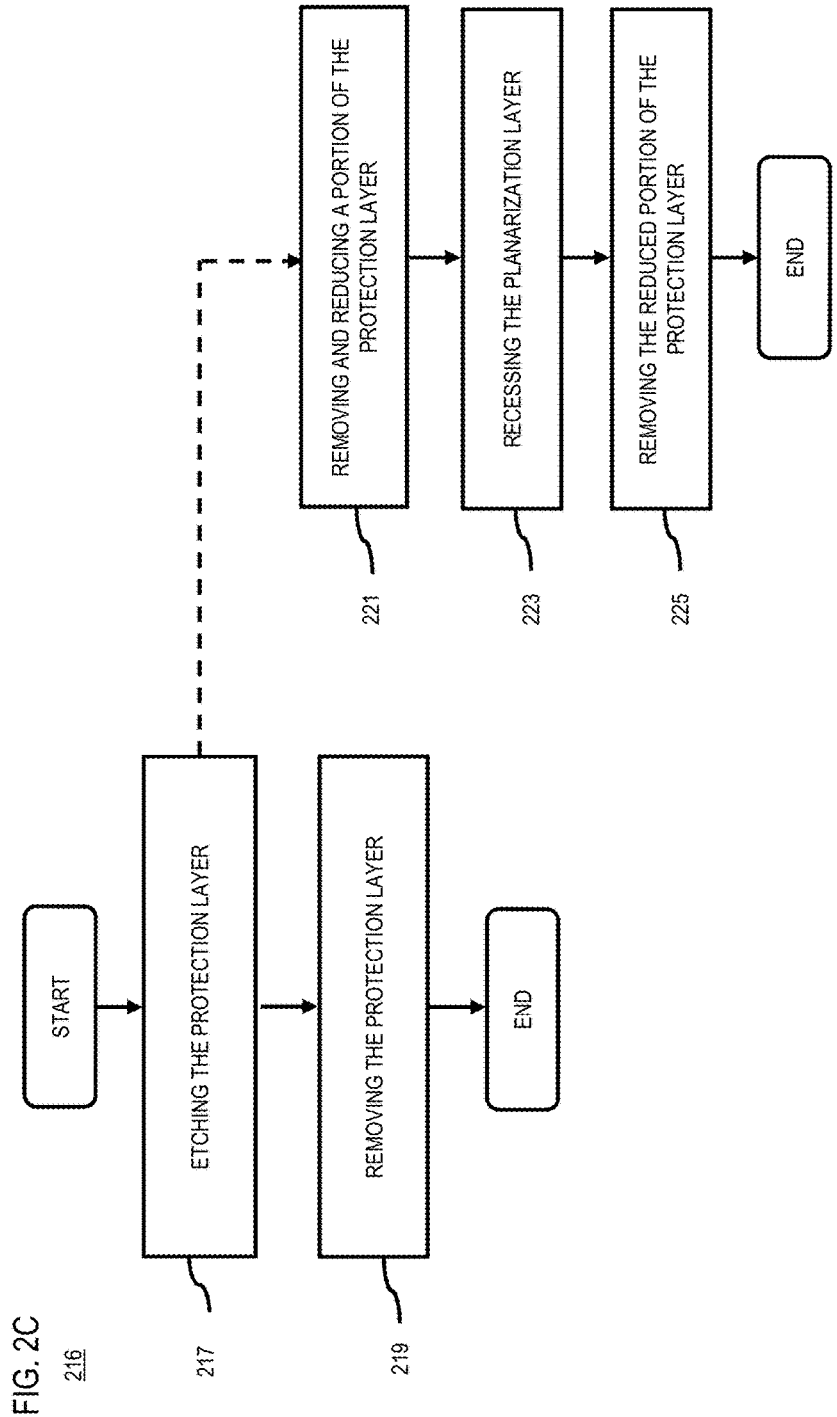

ASYMMETRIC SPACER FOR PREVENTING EPITAXIAL MERGE BETWEEN ADJACENT DEVICES OF A SEMICONDUCTOR AND RELATED METHOD

TECHNICAL FIELD

The present disclosure relates to semiconductor fabrication. In particular, the present disclosure relates to the formation of side wall spacers for preventing epitaxial merge between respective devices of a semiconductor.

BACKGROUND

Semiconductors have been continuously scaled down in size to increase performance and reduce power consumption. This has led to the advent of more efficient, scalable electronic devices and increased user experiences. However, this has also increased the complexity of device manufacture. One area of challenge faced by manufacturers is managing the epitaxial (epi) merge that occurs between adjacently placed fins spaced apart within a substrate. Epi merge occurs when diamond shaped crystals intersect one another due to growth of an epitaxial layer. In certain instances, epi merge is required to achieve sufficient source/drain epitaxial growth to merge adjacent semiconductor fins, i.e., fins belonging to a common device within the semiconductor. However, such growth can also cause undesired merging of adjacent semiconductor fins. For example, epi merge can lead to shorting of a p-type or n-type source/drain or crossing of fins across devices, i.e., n-p boundary breach.

To address this issue, manufacturers often employ a spacer on the fin sides to limit epi growth. While the spacers may prevent epi merge by serving as a barrier between respective fins, they also limit epitaxial growth within a device which limits device performance.

A need therefore exists for a device and related method capable of preventing epi merge between adjacent devices of a semiconductor while enhancing epi merge within said devices.

SUMMARY

An aspect of the present disclosure is a semiconductor having outer sidewall spacers of a height for confining the growth of an epitaxial layer to a device boundary of the semiconductor. Still further, another aspect of the present disclosure is a semiconductor having inner sidewall spacers of a height suitable for merging the epitaxial layer within a device of the semiconductor.

Further aspects of the present disclosure are a device including a plurality of fins extending upward through a surface of a substrate to form a device of a semiconductor. Another aspect of the device is an asymmetric sidewall spacer placed along the sides of the device. Another aspect of the device is an epitaxial layer placed within the device. The height of the asymmetrical sidewall spacer is greater than the height of internal sidewall spacers within the device. Still yet, another aspect of the device is a plurality of internal sidewall spacers placed along the sides of each of the plurality of fins within the device. The lateral growth of the epitaxial layer is confined by the asymmetric sidewall spacer and the internal growth of the epitaxial layer within the device expands around the internal sidewall spacers, the plurality of fins, or a combination thereof.

Further aspects of the present disclosure are a device including a substrate. Another aspect of the device includes a first and second plurality of fins deposited within the substrate. Another aspect of the device includes a spacer formed over the first and second plurality of fins, a portion of the spacer etched to a first height to form inner sidewalls within a space between each of the plurality of fins and another portion of the spacer etched to a second height to form outer sidewalls. Another aspect of the device includes a protection layer formed over the spacer. Yet another aspect of the device includes a planarization layer formed over the protection layer and the spacer. Still yet another aspect of the device includes an epitaxial layer deposited within the bounds of the inner sidewalls and outer sidewalls.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including forming a protection layer over a spacer formed over a first and second plurality of fins deposited within a substrate; pinching off a portion of the protection layer formed within a space between each of the plurality of fins; forming a planarization layer over the protection layer and the spacer; and etching a portion of the spacer to form inner sidewalls between each of the plurality of fins, outer sidewalls of a height greater than the height of the inner sidewalls for preventing the growth of the epitaxial layer beyond the outer sidewalls, or a combination thereof.

Further technical effects of the present disclosure include growing the epitaxial layer within the bounds of the inner sidewalls, the outer sidewalls, or a combination thereof to form asymmetric diamond shaped crystals. The growth includes a merging of the crystals. Another technical effect of forming of the planarization layer further includes depositing an organic material, an amorphous silicon material, or a combination thereof as the planarization layer. The deposit is based on an etch selectivity requirement being achieved through use of the organic material in comparison with a lower dielectric value of the spacer.

Still further, another technical effect includes polishing the amorphous silicon material to a high modularity. The polishing is performed chemically, mechanically or a combination thereof. Another technical effect includes recessing the planarization layer to a height below each of the plurality of fins. The planarization layer remains between the first and second plurality of fins after the recession. Another technical effect includes etching the protection layer. The protection layer is formed from one or more of an amorphous hydrogenated carbon (a-C), an amorphous silicon (a-Si), an aluminum oxide ($Al_2O_3$), a polymer or a combination thereof.

Another technical effect includes removing the pinched off portion of the protection layer and the portion of the protection layer formed between the first and second plurality of fins. The pinched off portion is a chamfer for supporting the removal. Another technical effect includes removing the pinched off portion of the protection layer and reducing the portion of the protection layer formed between the first and second plurality of fins. The reduction is to the height of the reduced portion of the protection layer and the reduced portion of the protection layer is surrounded by the planarization layer. The height of the reduced portion of the protection layer is greater than the height of the portion of the spacer formed between the first and second plurality of fins and the space between the first and second plurality of fins is a distance between a first and second device of a semiconductor. Another technical effect of the etching of the portion of the spacer formed between the first and second plurality of fins further includes recessing the planarization layer. Still further, another technical effect includes removing the reduced portion of the protection layer.

Another aspect of the present application includes a method including forming fins in substrate for a device; forming an asymmetric sidewall spacer placed along the sides of the device; and forming an epitaxial layer within the device, wherein a height of the asymmetrical sidewall spacer is greater than a height of internal sidewall spacers within the device.

Additional aspects include forming a internal sidewall spacers along the sides of each of the fins within the device, wherein a lateral growth of the epitaxial layer is confined by the asymmetric sidewall spacer and the internal growth of the epitaxial layer within the device expands around the internal sidewall spacers, the plurality of fins, or a combination thereof. Other aspects include growing the epitaxial layer to form asymmetric diamond shaped crystals, wherein the crystals merge within the device.

Additional aspects and technical effects of the present disclosure will become apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 2A through 2C are flowcharts of a process for preventing epitaxial merge between respective devices of a semiconductor, in accordance with exemplary embodiments.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problems of preventing epi merge between adjacent devices of a semiconductor while enhancing epi merge within the devices. In accordance with embodiments of the present disclosure, outer asymmetric sidewall spacers are placed alongside the fins of a semiconductor to confine the lateral growth of an epitaxial layer to a specific device of the semiconductor. In accordance with a further embodiment of the present disclosure, internal asymmetric sidewall spacers are placed alongside the fins of the semiconductor to enhance merging of the epitaxial layer within the device of the semiconductor.

Figure 1A:
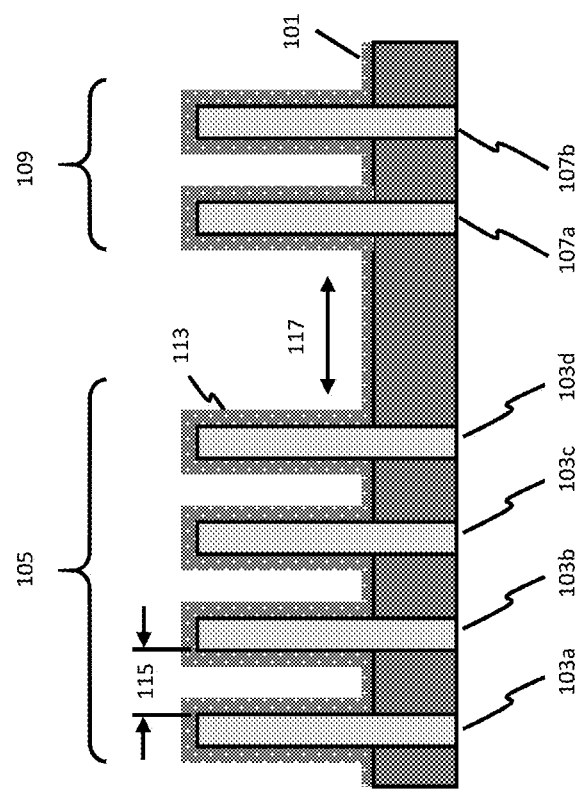
FIGS. 1A through 1O schematically illustrate cross-sectional views of a semiconductor having asymmetrical sidewalls for preventing epitaxial merge between respective devices of a semiconductor, in accordance with exemplary embodiments.

FIGS. 1A through 1O schematically illustrate cross-sectional views of a semiconductor having asymmetrical sidewalls for preventing epitaxial merge between respective devices of a semiconductor, in accordance with exemplary embodiments. The figures also depict an exemplary process flow for fabrication of the semiconductor.

For the purpose of illustration herein, a semiconductor may be fabricated as a discrete device (e.g., transistor, sensor) or fabricated to include an array of devices of varying type that are integrated upon a common substrate (e.g., integrated circuit, logic device). In the case of the latter, each device of the semiconductor is formed within the substrate (e.g., a silicon wafer) around a plurality (e.g., a grouping or sequence) of semiconductor fins. The fins are formed upon the substrate in a specific device region. Thus, each device region and subsequently formed device within said region of fins are spaced apart from one another on the substrate accordingly. As will be discussed later herein, the present invention prevents unwanted epi merge from occurring within the space between respective fins and/or devices of the semiconductor.

Still other aspects, features, and technical effects will be apparent to those skilled in the art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

In FIG. 1A, a cross-sectional view of a semiconductor device 100 is provided. The semiconductor device 100 includes a substrate 101, such as a silicon (Si) or silicon on insulator (SOI). The substrate 101 may be provided in wafer form and further processed, by way of known lithography or etching techniques, to form a plurality of fins 103a-103d (referred to herein collectively as fins 103) and 107a-107b (referred to herein collectively as fins 107). By way of example, the lithography process may include patterning the substrate 101 or a dielectric layer (not shown) formed atop the substrate 101 into said fins 103 and 107. In the case of etching, the process may be performed, for example, as a dry etch, reactive ion etch (RIE), plasma etch, ion beam etch, laser ablation, etc.

The fins 103 and 107 are formed within the substrate 101 as vertical structures extending through the surface of the substrate 101 to a fin height (labeled 111). By way of example, the fins 103 and 107 are fabricated to be exactly or substantially the same height relative to device design requirements, space restrictions, etc. Also, the fins 103 are formed in a first device region of the substrate 103 corresponding to a first device 105 of the semiconductor 100 while fins 107 are formed in a second device region corresponding to a second device 109. Thus, the fins serve as a framework upon which one or more fin devices are formed. This may include, for example, growing an epitaxial layer between or around the fins 103 and 107 for eventual development of multi-gate or active fin devices such as Field Effect Transistors (FinFETs) or passive fin devices such as capacitors, diodes, etc.

Figure 1B:
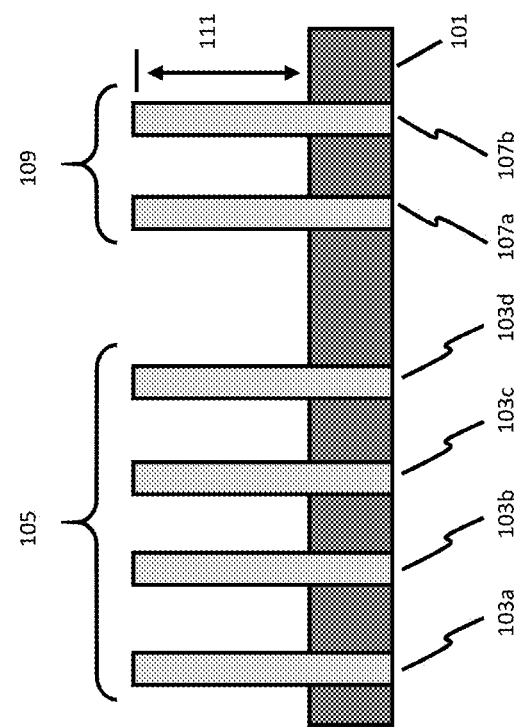

In FIG. 1B, a spacer 113 is conformal layer deposited over and between devices 105 and 109. The spacer 111 is deposited over each fin 103 and 107, as well as along the surface of the substrate 101 between respective fins. Thus, the spacer 113 is deposited to, at least initially, cover the surface of the semiconductor 100 in its entirety. Exemplary spacer materials may include an oxide, amorphous carbon, titanium nitride or silicon germanium (SiGe) in the case where the fins 103 and 107 are formed. In certain embodiments, the spacer 113 may also be formed of a low dielectric (low-k) material. It is noted that the space or distance 115 between respective fins within a device 105 and 109 can be less than the space or distance 117 between adjacent devices. The spacer material applied is able to cover the fin within the distance 115 between fin 103 and 107 without closing the gap.

In FIG. 1C, a protection layer 119 is formed over the spacer 113. The protection layer 119 protects the spacer 113 from breakage during etching and insulates the spacer 113 from planarization. By way of example, the protection layer 119 has a density (thickness) large enough to completely fill the space between respective fins 103 and 107. In addition, the protection layer 119 is pinched off within the space between each of the plurality of fins 103 and 107 to form chamfers 121.

Chamfering of the protection layer between respective spaces between fins 103 and 107 support subsequent removal 119 during the fabrication process. It is noted, in certain embodiments, that the protection layer 119 is formed from one or more of an amorphous hydrogenated carbon (a-C), amorphous silicon (a-Si), aluminum oxide ($Al_2O_3$), a polymer or a combination thereof.

In FIG. 1D, an etching of the protection layer 119 is performed. The etching may be performed based on a timed, isotropic film deposit/etch process. This may include a wet or chemical based etch, performed through use of a corrosive liquid or a chemically active ionized gas (e.g., plasma). Under this scenario, a select portion of the protective layer 119 is removed between respective devices 105 and 109.

Figure 1E:
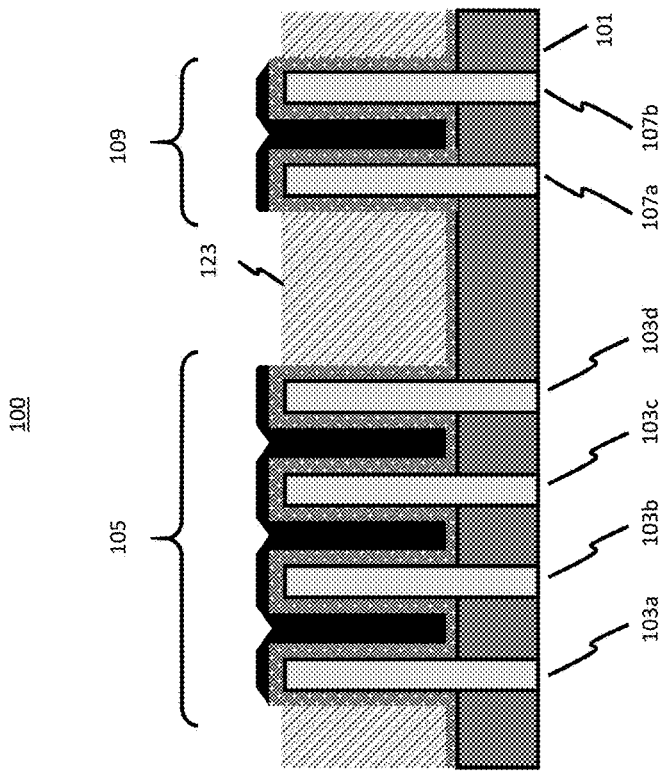
Figure 1F:
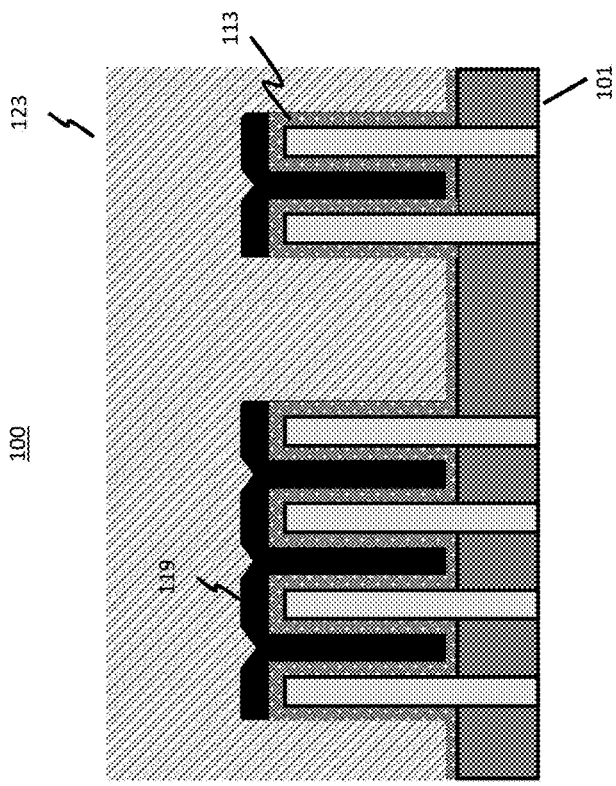

FIGS. 1E and 1F, depict the formation of a planarization layer 123. The planarization layer 123 is applied over the entire surface of the semiconductor 100, as shown in FIG. 1E, to support smoothing of planes and surfaces of the protection layer 119 and spacer 113 during fabrication. In certain embodiments, the planarization layer 123 is applied as an organic material (organic planarization layer (OPL)). Alternatively, the planarization layer 119 is deposited as an a-Si—a non-crystalline form of silicon—then polished to a polycrystalline surface.

Once formed, the planarization layer 123 is subsequently removed or recessed to a level (height) below the top of fins 103 and 107, as depicted per FIG. 1F. The removal may be carried out by etching of the organic planarization material. Alternatively, in the case of a-Si based material being applied, the planarization layer 123 may be recessed by forming shallow hollows on the a-Si surface after removal of an oxide layer. Under this scenario, removal of the oxide layer from the a-Si surface may be executed by way of a hydrogen bromide (HBr) plasma etch. It is noted the planarization layer 123 is removed or recessed below the top of fins 103 and 107 to ensure a portion of the planarization material remains between respective devices 105 and 109.

Figure 1H:
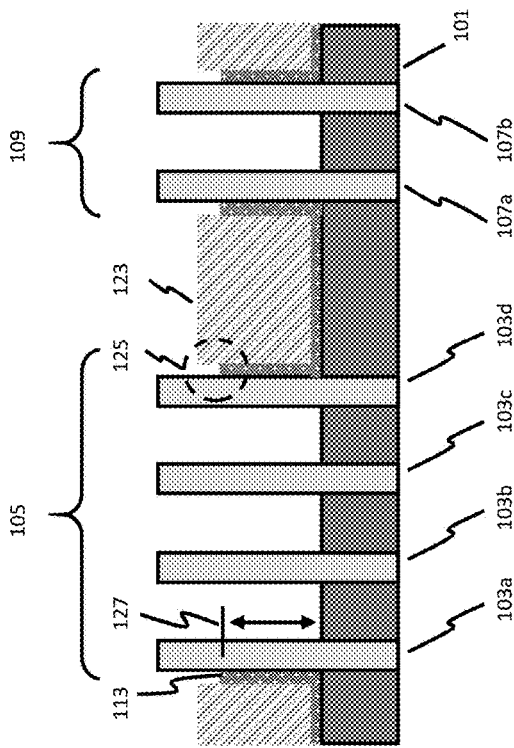
Figure 1G:
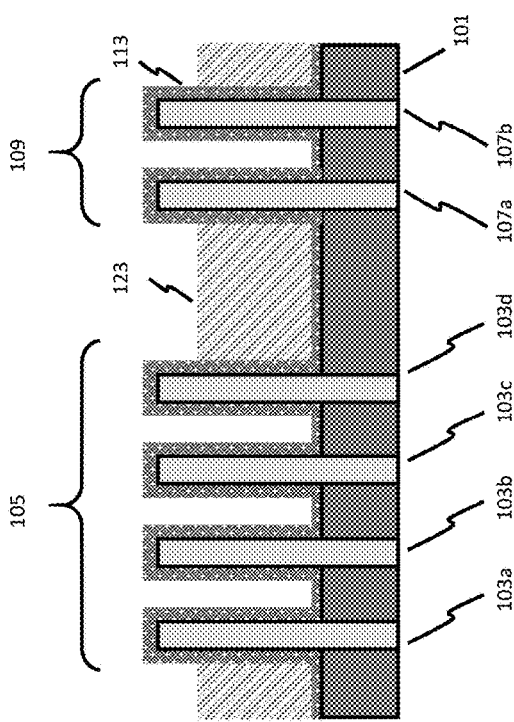

In FIG. 1G, the remaining portion of the protection layer 119 is etched. By way of example, thin film deep reactive-ion etching (DRIE) may be performed to create deep penetration and trenches in the protective layer for achieving removal. Per this approach, individual plasma molecules are accelerated by an electric field toward the surface of the protection layer. Upon striking the protection layer, the plasma molecules bind with those of the protection layer and the electrically neutral molecules float away to reveal an evenly etched spacer 113. The protection layer 119 is removed.

In FIG. 1H, the spacer 113 is etched. By way of example, reactive ion etching is performed to remove the portion of the spacer 113 formed atop and between each of the fins 103 and 107. Still further, a portion of the spacer 113 between the respective devices 105 and 109 is also etched. As such, the portion of the spacer 113 along the side of the outermost fins of a device 105 and 107 is removed to form a sidewall of a height 127. The sidewall is asymmetric, such that a complimentary sidewall need not be etched with identical symmetry. Rather, only similar function is required. The height 127 of the sidewall extends from the surface of the substrate 101 along the fin to form an outer device boundary for confining the epitaxial growth of the device. Still further, an Si recess procedure is performed to form a hollow 125 in a portion of the spacer and/or planarization layer 123, i.e., to support subsequent removal of the planarization layer 123.

In FIG. 1H, the planarization layer 123 is partially removed. Upon removal, only the portion of the spacer 113 between respective devices 105 and 109 remains. As such, the spacer 113 serves as an outer device boundary for confining the epitaxial growth. While not shown for illustrative convenience, inner (asymmetrical) sidewall spacers 131 may also be formed against the sides between respective fins 103 and 107.

In FIG. 1J, the cross-sectional view of the semiconductor 100 further depicts the growth of an epitaxial layer within respective devices 105 and 109. The epitaxial layer is deposited within the devices 105 and 109—i.e., on the surface between and/or around the plurality of fins 103 and 107—to form into asymmetric diamond shaped crystalline structures 129. The crystals 129 merge with one another within the bounds/confines of the outer sidewalls 113 and inner sidewalls 131. Still further, the height 127 of the outer sidewalls 113 confine the lateral growth of the epitaxial layer to a specific device, thus preventing epitaxial merge between respective devices 105 and 109. The fins 103 and 107 are depicted herein as dashed lines for indicating the growth of the epitaxial layer around the fins 103 and 107.

It is noted that (wanted) epi merge within devices 105 and 109 enhances semiconductor device 100 function while confining of the lateral growth of the epitaxial layer prevents unwanted epi merge between devices and/or fins. Table 1 below depicts exemplary device dimensions for maximizing device function. The heights of the inner and outer sidewall spacers and/or spacer distances between devices 105 and 109 may be formed based on these dimensions.

TABLE 1

| Fin space (within a device) | 22 nm |
| Fin space (between devices) | 54 nm-48 nm |
| Fin height | 41.5 nm |

It is noted that the height of the inner sidewalls and outer sidewalls may be formed to various heights for accommodating different fin requirements and device structures. The height of the outer sidewalls is always greater than the height of the inner sidewalls for confining the lateral growth of the epitaxial layer. It is contemplated, however, in certain embodiments that the inner sidewalls may be of a negligible height or removed entirely during the etching process so as to further control epitaxial merge within a device.

Figure 1L:
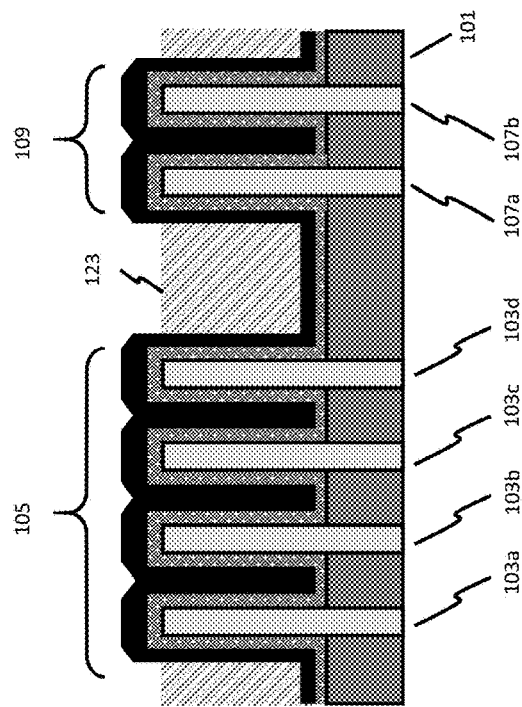
Figure 1K:
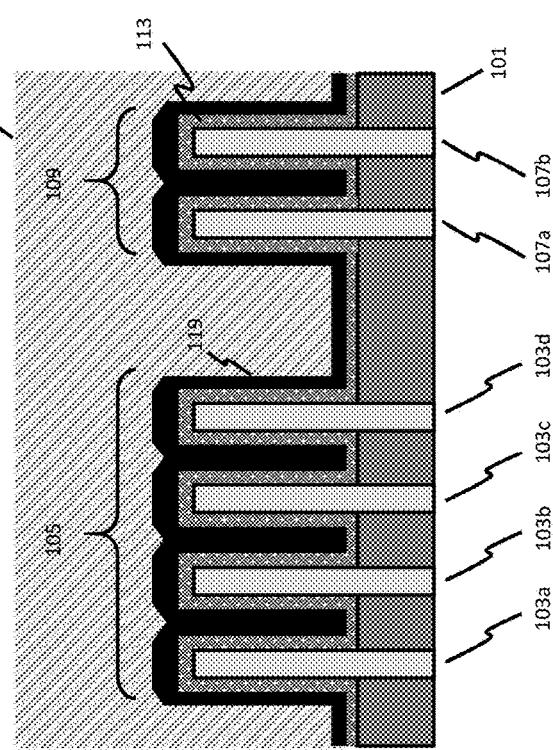

In FIGS. 1K and 1L, an alternate embodiment is provided. By way of example, the exemplary process flow corresponds to a scenario wherein the planarization layer 123 employed (e.g., per FIG. 1E) does not meet an etch selectivity requirement relative to the dielectic value of the spacer 113. Etch selectivity is a ratio for indicating the extent to which a substrate may be etched. Thus, when a low-k spacer 113 is employed, the selectivity of the planarization material 123 must be high enough to etch the spacer 113.

In FIG. 1K, the planarization layer 123 is applied over the entire surface of the semiconductor 100 and polished to a polycrystalline surface. Under this scenario, the protection layer 119 remains unetched so that is covered by the planarization layer 123 in its entirety. The polishing is performed such that the modularity, i.e., stiffness/rigidity, of the protection layer and spacer is increased. Once polished and formed (e.g., allowed to set), the planarization layer 123 is subsequently removed or recessed to a level (height) below the fins 103 and 107, as depicted per FIG. 1L. The removal may be carried out by etching of the polished planarization material.

Figure 1M:
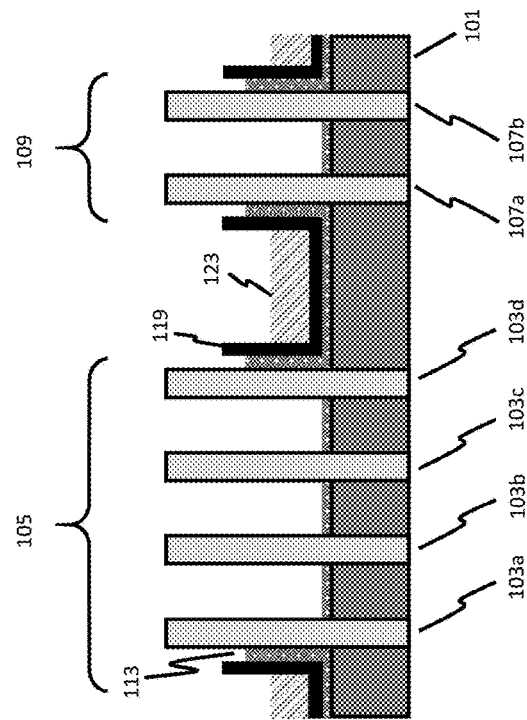

FIG. 1M depicts selective removal of the protection layer 119. The removal may correspond to a film deposited etching process. Under this scenario, the protection layer 119 is removed from atop and between each of the plurality of fins to reveal the spacer 113. However, a portion of the protection layer 119 between respective devices 105 and 109 remains formed over the spacer 113 and is encompassed by the planarization layer 123.

Figure 1N:
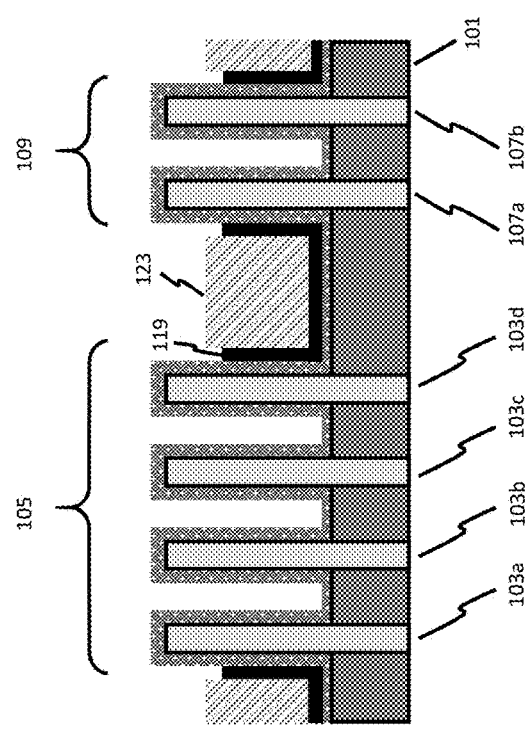

Adverting to FIG. 1N, an etching of the lower dielectric (low-k) spacer 113 is performed. Under this scenario, RIE is performed to remove the portion of the spacer 113 formed atop and between each of the plurality of fins 103 and 107. However, a portion of the spacer 113 between the respective devices 105 and 109 remains such that it is behind the film deposited protection layer 119. The planarization layer 123 is further recessed to a level (height) for supporting additional etching of the protection layer 119 and spacer 113 for forming the outer sidewalls.

In FIG. 1O, the planarization layer 123 is recessed. Under this scenario, the film deposited protection layer 119 is also removed via etching to reveal the inner and outer (asymmetric) sidewall spacers 113. Resultantly, the epitaxial layer may be deposited within the devices 105 and 109—i.e., on the surface between and/or around the plurality of fins 103 and 107—to form into asymmetric diamond shaped crystalline structures.

It is noted the above described alternative process flows achieve the same outcome as the prior described exemplary process flows described with respect to FIGS. 1A-1J. This includes confined lateral epitaxial growth for preventing unwanted epi merge between devices and/or fins with increased internal epi merge within a device 105 and 109 for enhanced semiconductor 100 performance. Furthermore, the crystalline growth occurs within the device to surround the fins 103 and 107 and effectively connect/merge them within the device 105 and 109.

FIGS. 2A through 2C are flowcharts of a process for preventing epitaxial merge between respective devices of a semiconductor, in accordance with exemplary embodiments. The process steps herein may be performed in accordance with any known device or microprocessor manufacturing, design or fabrication procedure and may be performed in different order. The steps as performed, in whole or in part, to result in the formation of a semiconductor having outer sidewalls of a greater height than inner sidewalls for confining the growth of an epitaxial layer between devices while maximizing epi merge within a device.

In step 201 of process 200 (FIG. 2A), a protection layer is formed over a spacer formed over a first and second plurality of fins deposited within a substrate. The substrate may be silicon or a SOI. In another step 203, a portion of the protection layer is pinched off within a space between each of the plurality of fins. In another step 205, a planarization layer is formed over the protection layer and the spacer. The planarization layer may be an organic material or amorphous silicon.

Per step 207, the planarization layer is recessed to a height below each of the plurality of fins. The planarization layer remains between the first and second plurality of fins after the recession. In another step 209, a portion of the spacer is etched to form inner sidewalls between each of the plurality of fins, outer sidewalls of a height greater than the height of the inner sidewalls for preventing the growth of the epitaxial layer beyond the outer sidewalls, or a combination thereof. As noted previously, the height of the inner sidewalls may be negligible (non-existent) or formed to a smaller height suitable for enabling epi merging. In yet another step 211, the epitaxial layer is grown within the bounds of the inner sidewalls, the outer sidewalls, or a combination thereof to form asymmetric diamond shaped crystals. The growth includes a merging of the crystals.

In step 213 of process 212 (FIG. 2B), the step of forming of the planarization layer includes depositing an organic material, an amorphous silicon material, or a combination thereof as the planarization layer. The deposit is based on an etch selectivity requirement being achieved through use of the organic material in comparison with a lower dielectric value of the spacer. In another step 215, the amorphous silicon material is polished to a high modularity. The polishing is performed chemically, mechanically or a combination thereof. Selection of the planarization material may be based on semiconductor, device and/or fabrication and design requirements.

In step 217 of process 216 (FIG. 2C), the protection layer is etched. As noted previously, the etching may be performed as a film-deposit reactive ion etch or other known etching process. The protection layer is formed from one or more of an amorphous hydrogenated carbon (a-C), amorphous silicon (a-Si), aluminum oxide ($Al_2O_3$), a polymer or a combination thereof.

In another step 219, the pinched off portion of the protection layer and the portion of the protection layer formed between the first and second plurality of fins are removed. The pinched off portion is a chamfer for supporting the removal of the protection layer. This corresponds to a first approach to removal of the protection layer. In another step 221, the pinched off portion of the protection layer is reduced and the portion of the protection layer formed between the first and second plurality of fins is reduced.

The reduction is to the height of the reduced portion of the protection layer and the reduced portion of the protection layer is surrounded by the planarization layer. The height of the reduced portion of the protection layer is greater than the height of the portion of the spacer formed between the first and second plurality of fins and the space between the first and second plurality of fins is a distance between a first and second device of a semiconductor. It is noted step 221 corresponds to a second (alternative) approach to removal of the protection layer, i.e., based on the etch selectivity requirement being achieved through use of an organic planarization material in comparison with a lower dielectric value of the spacer.

Per step 223, the etching of the portion of the spacer formed between the first and second plurality of fins includes recessing the planarization layer. In yet another step 225, the etching further includes removing the reduced portion of the protection layer.

Devices formed in accordance with embodiments of the present disclosure enjoy utility in various industrial applications, e.g., microprocessors, smart-phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in the manufacture of any of various types of highly integrated semiconductor devices. The present disclosure is particularly applicable in semiconductor devices such as finFETS in the advanced technology nodes.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a protection layer over a spacer formed over a first and second plurality of fins deposited within a substrate;
   pinching off a portion of the protection layer formed within a space between each of the plurality of fins;
   forming a planarization layer over the protection layer and the spacer; and
   etching a portion of the spacer to form inner sidewalls between each of the plurality of fins, outer sidewalls of a height greater than the height of the inner sidewalls for preventing the growth of the epitaxial layer beyond the outer sidewalls, or a combination thereof.

2. The method of claim 1, further comprising:
   growing the epitaxial layer within the bounds of the inner sidewalls, the outer sidewalls, or a combination thereof to form asymmetric diamond shaped crystals,
   wherein the growth includes a merging of the crystals.

3. The method of claim 1, wherein the forming of the planarization layer further comprises:
   depositing an organic material, an amorphous silicon material, or a combination thereof as the planarization layer,
   wherein the deposit is based on an etch selectivity requirement being achieved through use of the organic material in comparison with a lower dielectric value of the spacer.

4. The method of claim 3, further comprising:
   polishing the amorphous silicon material to a high modularity,
   wherein the polishing is performed chemically, mechanically or a combination thereof.

5. The method of claim 1, further comprising:
   recessing the planarization layer to a height below each of the plurality of fins,
   wherein the planarization layer remains between the first and second plurality of fins after the recession.

6. The method of claim 1, further comprising:
   etching the protection layer,
   wherein the protection layer is formed from one or more of an amorphous hydrogenated carbon (a-C), amorphous silicon (a-Si), aluminum oxide (Al2O3), a polymer or a combination thereof.

7. The method of claim 6, further comprising:
   removing the pinched off portion of the protection layer and the portion of the protection layer formed between the first and second plurality of fins,
   wherein the pinched off portion is a chamfer for supporting the removal.

8. The method of claim 6, wherein further comprising:
   removing the pinched off portion of the protection layer and reducing the portion of the protection layer formed between the first and second plurality of fins,
   wherein the reduction is to the height of the reduced portion of the protection layer and the reduced portion of the protection layer is surrounded by the planarization layer.

9. The method of claim 8, wherein the height of the reduced portion of the protection layer is greater than the height of the portion of the spacer formed between the first and second plurality of fins and the space between the first and second plurality of fins is a distance between a first and second device of a semiconductor.

10. The method of claim 9, wherein the etching of the portion of the spacer formed between the first and second plurality of fins further comprises:
    recessing the planarization layer; and
    removing the reduced portion of the protection layer.

11. A method comprising:
    forming fins in substrate for a device;
    forming an asymmetric sidewall spacer placed along the sides of the device; and
    forming an epitaxial layer within the device,
    wherein a height of the asymmetrical sidewall spacer is greater than a height of internal sidewall spacers within the device.

12. The method of claim 11, further comprising:
    forming a internal sidewall spacers along the sides of each of the fins within the device,
    wherein a lateral growth of the epitaxial layer is confined by the asymmetric sidewall spacer and the internal growth of the epitaxial layer within the device expands around the internal sidewall spacers, the plurality of fins, or a combination thereof.

13. The method of claim 11, further comprising:
    growing the epitaxial layer to form asymmetric diamond shaped crystals, wherein the crystals merge within the device.

* * * * *